US005483037A

United States Patent [19]

Mashburn

[11] Patent Number: 5,483,037
[45] Date of Patent: Jan. 9, 1996

[54] MULTIPLE TARGET LASER ABLATION SYSTEM

[75] Inventor: Douglas N. Mashburn, Knoxville, Tenn.

[73] Assignee: Martin Marietta Energy Systems, Inc., Oak Ridge, Tenn.

[21] Appl. No.: 159,614

[22] Filed: Dec. 1, 1993

[51] Int. Cl.[6] .......................... B23K 26/00; B23K 26/12
[52] U.S. Cl. ................... 219/121.68; 219/121.72; 219/121.85; 219/121.65; 219/121.61; 427/509; 427/554; 118/50.1
[58] Field of Search .................... 219/121.68, 121.69, 219/121.85, 121.47, 121.72, 121.61; 427/508, 509, 554–557, 533–535; 118/50.1, 715, 723, 726

[56] References Cited

U.S. PATENT DOCUMENTS

| | | | |
|---|---|---|---|
| 4,987,007 | 1/1991 | Wagal et al. | 427/53.1 |
| 5,206,216 | 4/1993 | Yoshida | 427/117 |
| 5,212,148 | 5/1993 | Roas et al. | 505/1 |
| 5,227,363 | 7/1993 | Furukawa et al. | 427/564 |
| 5,324,552 | 6/1994 | Opower et al. | 427/533 |
| 5,334,252 | 8/1994 | Yoshida et al. | 118/726 |
| 5,334,815 | 8/1994 | MacNaughton et al. | 219/121.7 |

Primary Examiner—Mark H. Paschall
Attorney, Agent, or Firm—E. A. Pennington; H. W. Adams

[57] ABSTRACT

A laser ablation apparatus and method are provided in which multiple targets consisting of material to be ablated are mounted on a movable support. The material transfer rate is determined for each target material, and these rates are stored in a controller. A position detector determines which target material is in a position to be ablated, and then the controller controls the beam trigger timing and energy level to achieve a desired proportion of each constituent material in the resulting film.

16 Claims, 2 Drawing Sheets

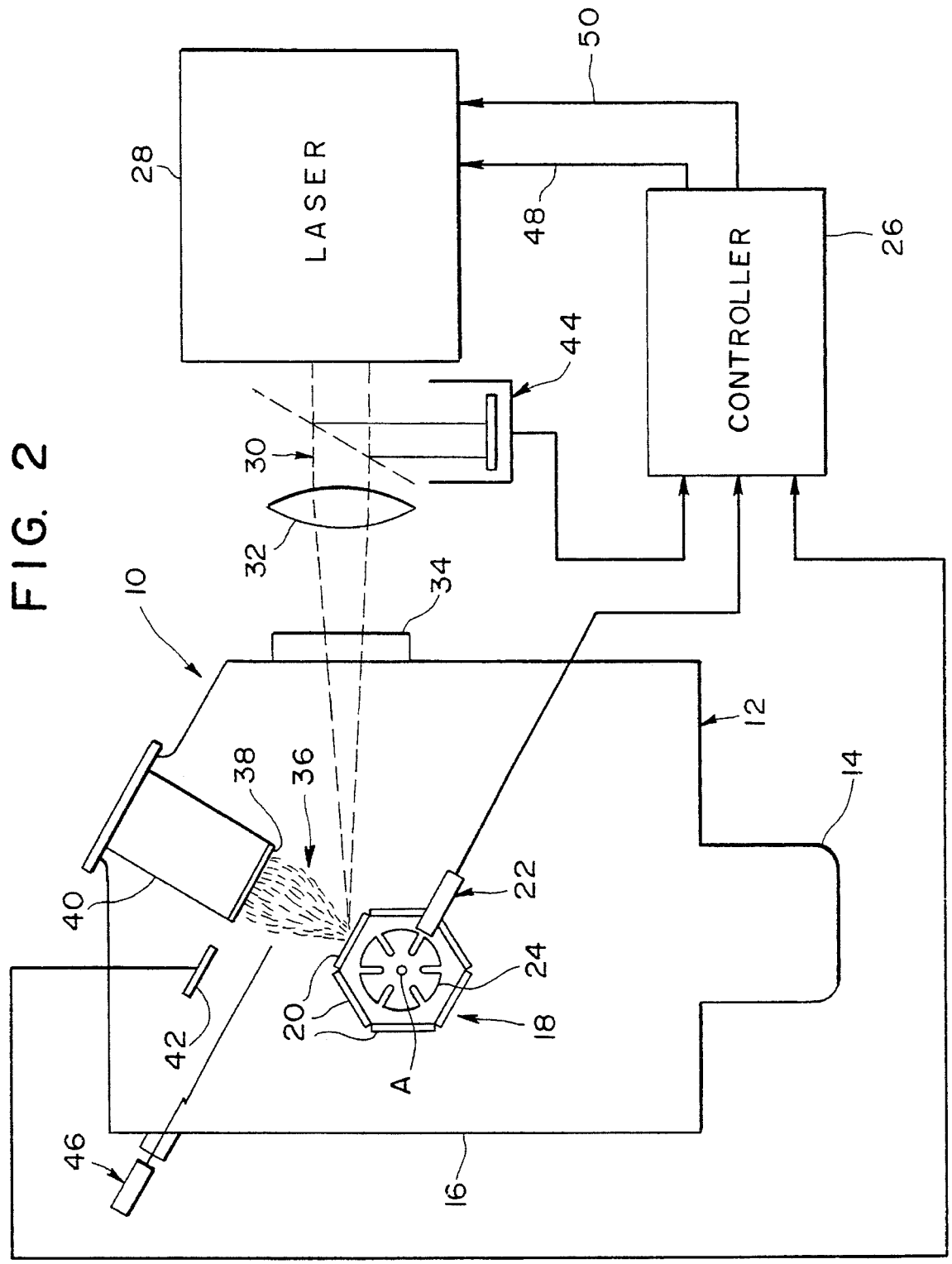

MULTIPLE TARGET LASER ABLATION SYSTEM

This invention was made with Government support under contract DE-AC05-840R21400 awarded by the U.S. Department of Energy to Martin Marietta Energy Systems, Inc. and the Government has certain rights in this invention.

FIELD OF THE INVENTION

The present invention relates generally to laser ablation devices and, more specifically, to a rapidly switched multiple target laser ablation system for depositing metal and metal oxide films on a substrate. The metal and metal oxide components are ablated individually or in combination by placing them on a movable support and synchronizing discharges of an ablation laser with movement of the support.

BACKGROUND OF THE INVENTION

Laser-assisted evaporation has been used previously to deposit thin films of superconducting materials such as $YBa_2Cu_3O_7$. The deposition process utilizes a high power, pulsed excimer laser to ablate superconducting material from the face of a superconducting pellet and to deposit the same onto a nearby substrate.

As shown in FIG. 1, a vacuum chamber 1 is coupled to a pump 2. A laser beam 3 enters the chamber 1, after passing through a focusing lens, through a quartz window 5 and strikes a pellet 6 of superconductor material. The pellet 6 is mounted about 1–5 cm from a substrate 8, which is heated by heater 9, while a vacuum of about $1\times10^{-6}$ torr is maintained. The beam 3 of pulsed 248 nm light is generated by a KrF laser source. A white plasma is produced at the surface of the pellet 6 and a visible plume 7 of excited ejected particles extends toward substrate 8. Typical resulting film thicknesses range from 0.1 to 3 μm.

By ablating a high transition temperature superconducting composition, a superconducting thin film may be obtained on a suitable substrate as described above. However, the ability to vary the film composition in a controlled manner has been identified as a problem, particularly for research and development purposes.

In the past, control of the final film composition was accomplished by changing the mix of a single target. This approach has involved preparation of many pellets of varying composition requiring days or weeks before a determination could be made regarding the composition of the deposited film. Variability had to be traced back through target preparation, film deposition conditions and film analysis.

SUMMARY OF THE INVENTION

An object of the present invention is to provide a laser ablation system capable of rapidly exchanging multiple source materials.

Another object of the present invention is to provide a laser ablation system capable of varying a superconductor film composition in a controlled manner.

Another object of the present invention is to provide a laser ablation system capable of depositing a continuous crystallin structure having multiple layers deposited with atomically sharp transitions therebetween.

These and other objects of the invention are met by providing a laser ablation method which includes the steps of sequentially laser ablating pure components of a metal or metal oxide in a vacuum, and collecting the ablated components on a suitable heated substrate to provide a crystalline composition having desirable electronic properties.

More specifically, the invention is a process for preparing high temperature superconducting oxide films of the type $LnBa_2Cu_3O_{7-x}$, where Ln is an element selected from the lanthanide group;

Ba is barium;

Cu is copper;

O is oxygen; and x is a small number less than 1;

wherein individual elements of superconductor component are sequentially laser ablated in vacuum and deposited on a substrate in an amount proportional to its presence in the superconducting oxide composition.

Another aspect of the present invention is to provide an apparatus which includes an indexable rotating drum on which are mounted a plurality of individual components making up the superconducting composition. The drum is placed in a vacuum chamber, and rotated at low or high speed. The laser is synchronously discharged with energy proportioned to generate the desired proportion of components.

The individual components may be placed on the rotating drum as metals or as metal oxides, insulators, semiconductors, superconductors, or as other solid, stable materials sought to be deposited. If in the form of a metal, a source of oxygen, such as a hot bleed or background oxygen in the containment, will be required since the deposited film must be in the form of an oxide. Alternatively, a second rotating drum having frozen oxygen thereon may be placed in the system adapted to be ablated by the laser also. If metal oxides are used an target material, the deposited composite will be in the form of an oxide. Annealing in an oxygen bearing atmosphere may be required as a final treatment in order to achieve the desired stoichiometry.

Other objects, advantages and salient features of the invention will become apparent from the following detailed description, which taken in conjunction with the annexed drawings, discloses preferred embodiments of the invention.

BRIEF DESCRIPTION OF THE DRAWINGS

FIG. 2 is a schematic view of a laser ablation apparatus according to a preferred embodiment of the present invention.

DETAILED DESCRIPTION OF THE INVENTION

Figure 1:
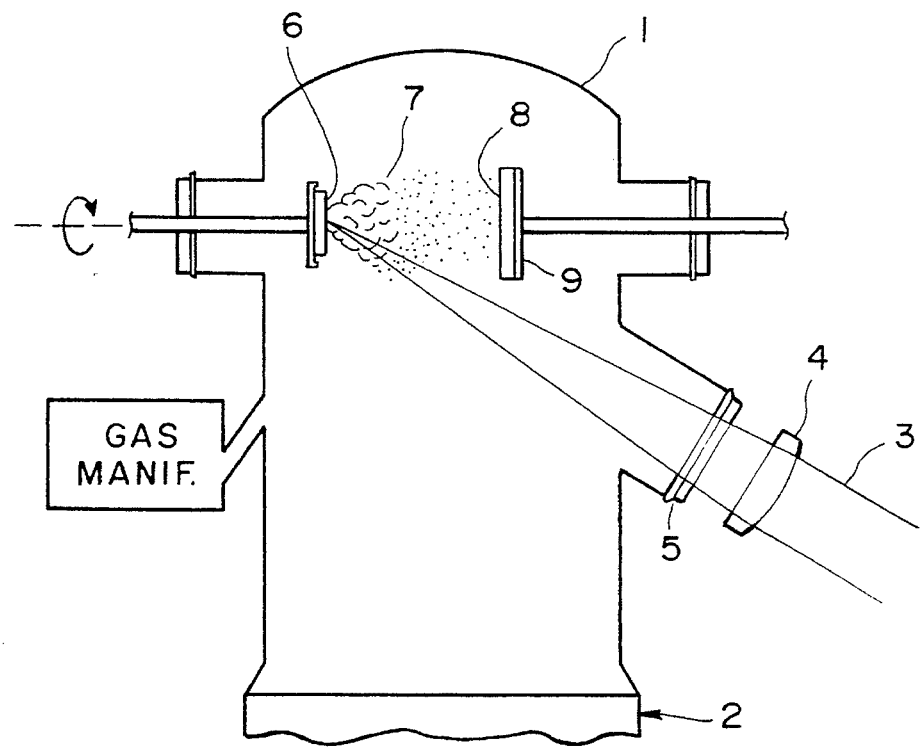
FIG. 1 is a schematic view of a known laser ablation apparatus using a single pulsed laser ablation beam.

Referring to FIG. 2, a laser ablation system 10 includes a laser ablation chamber 12 which interior is maintained at a vacuum by a turbo pump 14. A continuous sidewall 16 defines the interior of the chamber 12.

A movable support 18 is mounted in the ablation chamber 12. In the illustrated embodiment, the support 18 is a rotable drum having a plurality of target segments 20, each made of material to be ablated, mounted on the periphery of the rotatable drum 18 at equi-angular positions.

The drum is rotated about rotation axis "A" by any suitable means for imparting high speed rotation, such as an electric motor (not shown). The motor or actuator can be located within or outside the vacuum chamber, although in the later case suitable sealing means would be provided where the drive shaft passes through the sidewall 16 of the vacuum chamber 12.

Position detection means are provided for producing a signal indicative of the angular position of the drum 18. In the illustrated embodiment, the detection means includes a synchronization pickup 22 which cooperates with a position indexer 24 mounted on and rotatable with the drum 18 to produce a signal indicative of the position of the rotatable drum 18 and thus the target segments 20 mounted thereon.

As an example, the position indexer 24 can be an aluminum disk having a plurality of radially disposed slots formed therein, and the pickup 22 can be a light emitting diode (LED) and photodiode pair. Light from the LED is interrupted by the disk 24, except when the slots pass between the LED and photodiode. Thus, a position signal is generated when the slots pass through the pickup 22. This type of position detector is inexpensive, relatively simple and accurate, and has been used in personal computers for indicating position of a floppy disk. Of course, any other suitable position detectors can be employed.

This arrangement produces an electrical pulse each time the indexer slot passes through the detector beam. This electrical signal is supplied to a controller 26 to help determine, along with other inputs, control of a pulsed ablation laser 28. The controller 26 controls the laser timing and energy levels needed to achieve a desired film composition.

The laser 28 is preferably a excimer laser capable of a high repetition rate, capable of being fired externally with better than microsecond timing repeatability, and employing electronic charge voltage control, modified if necessary to allow adjustment up and down for each pulse at full repetition rate such as, for example, 80 or 200 Hz.

A laser beam 30 output from the laser source 28 is focused by a focusing lens 32 onto a target 20 in the ablation chamber 12. A quartz window 34 is provided in the sidewall 16 of the ablation chamber 12 to permit passage of the beam 30 into the chamber 12. When the beam is focused on the target, a plume 36 is generated. The plume 36 emanates towards a substrate 38 mounted on a heater/support 40. Preferably, the substrate 38 faces the target being ablated.

An important aspect of the present invention is the control of the laser output to effect a desired composition of thin film deposit on the substrate. In the past, a single target made of YBCO compound was ablated. It was not, however, possible by any simple means to determine the film composition during the film deposition activity. The film had to be removed from the chamber and analyzed by Rutherford Back Scattering in an accelerator laboratory, or by EDX in an electron microscope, or some other means.

It was known then that film deposition rates of simple stable materials could be accurately measured in conventional vacuum deposition systems using a commercially available quartz crystal thin film rate monitor. In this monitor, an electrical signal varied according to mass being added to the surface of a quart plate. However, in order to do so, one must know the composition of the film being measured. If the composition is not well known, neither is the deposition rate. Consequently, the quartz crystal thin film rate monitor has heretofore offered little advantage in controlling conventional laser ablation deposition of compound material.

The present invention takes the stable components of the YBCO, the individual oxides ($Y_2O_3$, $BaO$, $CuO$) or the pure metals (Y, Ba, Cu) and any other elements or compounds needed, on separate segments of the drum 18 as the individual targets 20. When making a film, each constituent is ablated sequentially in proper proportions, so that the correct composition is achieved at the film.

In order to know what that proportion is, it is important to first determine how much of each target material a given laser pulse transfers. This is accomplished by making a calibration run before forming the film.

To make the calibration run, and referring to FIG. 2, the film substrate 38 is replaced with a quartz crystal thin film rate monitor 42, so that the surface of the quartz plate of the monitor 42 is positioned where the surface of the substrate would be during film deposition. The controller 26 is then programmed so that only one target segment is selected and so that the laser pulse energy is constant for each shot. During this procedure, the rate monitor output is stored for several pulses until an accurate measure of the material transferred at that energy level is determined. Then, the pulse energy setting is changed and the measurement is repeated. Repeating this procedure for several energies will build a calibration table for that particular target material.

The above procedures are repeated for each target material on the drum to thus determine the transfer rate for each material desired in a film deposition run.

After calibration, the quartz crystal thin film rate monitor 42 is replaced by the substrate/heater assembly (as shown in FIG. 2), and the apparatus is ready to deposit a film of known composition. Using the calibration tables, the user can specify how hard (including skipping) the laser is to fire on each target in order to generate the correct film composition. Under the operator's control, whereby the operator selects desirable proportions of selected materials, the system can effect abrupt but precise shifts in composition as may be desired for superlattices and artificially layered materials. It can include forming buffer layers, the main film, metallization layers for contacts, protective overcoats, etc. This could be valuable for hundreds or even thousands of materials in addition to the high temperature superconductors.

A pulse energy detector 44 produces an electrical signal indicative of the beam 30 intensity. This signal is provided to the controller 26 to effect feedback control of the laser pulse energy on the next cycle to prevent variations in laser characteristics, from introducing unwanted variations in film composition., this provides a slow response feedback affecting succeeding cycles. The controller could also adjust laser pulse energy to compensate for window fogging, target consumption, etc., if appropriate monitors are installed.

A shutter 46, operable from outside the chamber 12, provides means for shielding the substrate 38 during target cleaning by ablating away the surface layer.

As described above, the controller 26 receives input from the rate monitor 42, the energy detector 44, and the position detector 22. Based on the predetermined calibration values, the user can manually, or by computer programming, input at the controller 26 the desired laser energy for each target segment independent of the others, including skipping. The pulse firing rate is also input to generate a recipe such that extra target segments could be installed on the holder, but skipped during much of a film deposition, then activated as desired, to put down contacts on top of the film, for example.

The output 48 and 50 of the controller 26 are the external trigger and charge voltage inputs of the laser 28, respectively. The controller 26 thus provides the external circuits (which could be implemented in conventional electronics or through microcomputer with analog interface, or interface to a laser control computer) to keep track of which segment is in position in front of the ablation laser beam, and adjust the laser triggering time and pulse energy via the laser charge voltage or variable attenuators.

The laser 28 is thus controlled to have special and temporal characteristics of its optical output pulse, when focused with the aforementioned optics, to ablate materials such as Y2O3, CuO, BaO, Ba2O3, Cu, Ba, Y, etc. As an example, an energy density of 5 joules/cm2 focused in a 50 nanosecond pulse is adequate for a wide range of materials, including those listed above.

In an alternate embodiment, the components to be ablated may be in the form of a stacked plate assembly rather than on a rotating drum. IN this manner, the edge of the stack may be ablated by a suitably focused single or multiple laser beam(s). By oscillating or reciprocating the stacked assembly and synchronously firing the laser, the desired components can be selectively ablated. If a multiple beam is used on multiple targets simultaneously, the ablated material will appear as multiple plumes and be deposited as a uniformly mixed deposit. Multiple beams may be obtained from a single laser by splitting a single beam into multiple beams, which through attenuators, may be directed end-on to a stacked target structure.

The present invention uniquely uses a high voltage capacitor charge circuit to program each laser pulse for the corresponding target segment, giving the ability to adjust the deposition rate of each segment independently with simple additional circuitry or computer with D/A output. The use of high speed target switching makes feasible the tailoring of a film on an atomic layer basis.

Figure 3:
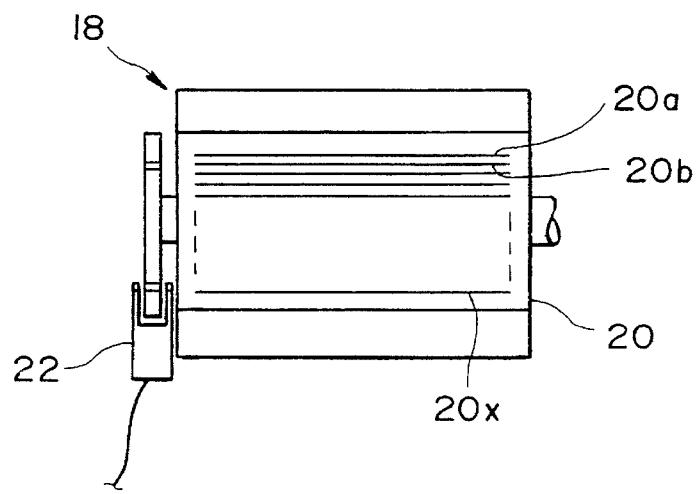
FIG. 3 is a front view of the rotatable drum used in the present invention.

Synchronization dither can be used within each segment time frame to both scan the laser spot over the new surface of the segment and vary the plume angle for wider substrate coverage, when a flat target is used. In the present invention, the pulse beam forms a line on the target where the material is ablated. As shown in FIG. 3, showing a front view of one of the targets 20, the first line 20a formed on the target 20 is formed during the first cycle of drum rotation. The line 20a is formed by one pulse of the laser beam, at a power level determined previously to achieve a desired amount of material ablation. The controller 26, having received a position signal from censor 22, outputs a trigger signal to the laser indicating that it is time to pulse the specific target 20 at its predetermined power level. The trigger timing is such that the next line 20b is formed adjacent the first line in the next cycle. Each subsequent pass results in an additional line spaced from the preceding one, until the last line 20x is formed. Thereafter, the trigger pulse places the next line over the first one 20a, and the sequence is repeated. This is what is meant by "synchronization dither". In effect, a slight delay is added to the trigger pulse timing with each succeeding cycle of drum rotation in order to effect scanning of the target surface.

The invention has potential for application in thin film deposition processes where rapid on-line composition control, including deliberate sharp variation, is needed in making semiconductor devices, optical coatings, and thin film superconductor samples and devices.

In addition to the rapid deposition of superconducting films for research purposes, the present method and apparatus are expected to offer an improved means for the preparation of artificially structured materials. Presently, high electron mobility transistor (HEMT) devices (a structure alternating between vary thin layers of doped and pure silicon) are being prepared by means of molecular beam effusion (MBE) which requires a very high vacuum, i.e., 10–10 torr. This makes the MBE process very expensive due to the amount of time required for bake-out and pump-down. The present invention is expected to provide a means for preparation of the HEMT-type structures rapidly and without the extremely long pump-down period.

While advantageous embodiments have been chosen to illustrate the invention, it will be understood by those skilled in the art that various changes and modifications can be made therein without departing from the scope of the invention as defined in the appended claims.

What is claimed is:

1. A laser ablation apparatus comprising:

an ablation chamber for containing a substrate;

an externally controllable laser source outputting a pulsed laser beam into the ablation chamber;

a movable support having a plurality of targets, each made of a different material to be ablated mounted thereon, each target being positionable to be irradiated by the laser beam;

means for determining a material transfer rate for each material mounted on the support for different energy levels of the laser beam; and control means for synchronizing target position with pulse timing and energy level for each different target material selected to be a constituent of a desired composition, based on the predetermined material transfer rates.

2. A laser ablation apparatus according to claim 1, further comprising position detection means for outputting a signal indicative of individual target position, the position signal being fed to control means.

3. A laser ablation apparatus according to claim 2, wherein the position detection means comprises a photodector.

4. A laser ablation apparatus according to claim 1, wherein the laser source is an excimer laser.

5. A laser ablation apparatus according to claim 1, wherein the movable support is a rotable drum.

6. A laser ablation apparatus according to claim 1, further comprising beam energy detection means, disposed in an optical path of the laser beam, for determining beam energy during ablation.

7. A laser ablation apparatus according to claim 6, wherein the control means includes feedback control means, coupled to the beam energy detection means, for changing the energy level to account for variations in laser characteristics.

8. A laser ablation apparatus according to claim 1, further comprising a substrate holder disposed in the ablation chamber opposite the target being ablated.

9. A laser ablation apparatus according to claim 1, wherein the material transfer rate determining means comprises a quartz crystal thin film rate monitor.

10. A laser ablation method comprising the steps of:

outputting a pulsed laser beam into an ablation chamber which contains a substrate;

mounting a plurality of targets, each made of a different material to be ablated, on a movable support disposed in the ablation chamber;

determining a material transfer rate for each different material mounted on the support for different energy levels of the laser beam; and synchronizing target position with pulse timing and energy level for each different target material selected to be a constituent of a desired composition, based on the predetermined material transfer rates.

11. A method according to claim 10, wherein the step of determining the material transfer rate comprises positioning a quartz crystal thin film rate monitor in the ablation chamber at a position where a film substrate would be positioned during ablation, selecting individual targets mounted on the support and exposing each individually to leaser beam pulses of different energy levels and determining an amount of deposition of ablated material for each energy level.

12. A method according to claim 10, wherein the synchronizing step comprises selecting particular target materials from those mounted on the support, and ablating the selected to achieve a desired proportion of the selected materials.

13. A laser ablation method according to claim 10, further comprising determining a position of each target with position detection means, and outputting a signal indicative of individual target position to a controller.

14. A laser ablation method according to claim 10, further comprising detecting beam energy during ablation with detection means disposed in an optical path of the laser beam.

15. A laser ablation method according to claim 14, further comprising varying the energy level of the laser beam with control means in accordance with the material transfer rate for each target material, and forming a feedback loop in the control means based on the detected beam energy during ablation.

16. A laser ablation method according to claim 10, further comprising adding a delay to pulse timing with each successive cycle to effect scanning of the laser beam over the surface of each target.

* * * * *